United States Patent
Kaskoun et al.

(10) Patent No.: US 8,717,057 B2
(45) Date of Patent: May 6, 2014

(54) INTEGRATED TESTER CHIP USING DIE PACKAGING TECHNOLOGIES

(75) Inventors: Kenneth Kaskoun, San Diego, CA (US); Sanjay K. Jha, San Diego, CA (US)

(73) Assignee: QUALCOMM Incorporated, San Digeo, CA (US)

( * ) Notice: Subject to any disclaimer, the term of this patent is extended or adjusted under 35 U.S.C. 154(b) by 0 days.

(21) Appl. No.: 12/192,719

(22) Filed: Aug. 15, 2008

(65) Prior Publication Data
US 2009/0322368 A1    Dec. 31, 2009

Related U.S. Application Data

(63) Continuation-in-part of application No. 12/147,918, filed on Jun. 27, 2008, now abandoned.

(51) Int. Cl.
*G01R 31/26* (2006.01)

(52) U.S. Cl.
USPC ............ 324/762.01; 324/762.02; 324/762.03; 324/750.3; 257/723; 365/201; 714/733

(58) Field of Classification Search
USPC ......... 324/763, 762.01–762.03, 750.3, 158.1; 714/733
See application file for complete search history.

(56) References Cited

U.S. PATENT DOCUMENTS

| | | | | |
|---|---|---|---|---|
| 5,535,164 A * | 7/1996 | Adams et al. | | 365/201 |
| 5,751,729 A * | 5/1998 | Aybay | | 714/718 |
| 6,064,219 A * | 5/2000 | Aigner | | 324/763 |
| 6,759,863 B2 * | 7/2004 | Moore | | 324/765 |
| 6,876,221 B2 * | 4/2005 | Ishigaki | | 324/765 |
| 6,906,514 B2 * | 6/2005 | Ausserlechner | | 324/251 |
| 7,424,659 B2 * | 9/2008 | Avraham | | 714/742 |
| 7,457,978 B2 * | 11/2008 | Johnson | | 713/401 |
| 7,863,918 B2 * | 1/2011 | Jenkins et al. | | 324/750.3 |
| 2001/0050573 A1 * | 12/2001 | Dumbri | | 324/763 |
| 2004/0227743 A1 * | 11/2004 | Brown | | 345/204 |
| 2004/0233649 A1 * | 11/2004 | Honlein et al. | | 361/760 |
| 2006/0289992 A1 | 12/2006 | Wood | | |
| 2006/0292711 A1 | 12/2006 | Su | | |
| 2007/0051949 A1 | 3/2007 | Schneider | | |
| 2008/0068039 A1 * | 3/2008 | Bernstein et al. | | 326/16 |
| 2009/0129186 A1 * | 5/2009 | Schnell et al. | | 365/201 |

OTHER PUBLICATIONS

International Search Report—PCT/US2009/048034, International Search Authority—European Patent Office Oct. 12, 2009.
Written Opinion—PCT/US2009/048034, International Search Authority—European Patent Office Oct. 12, 2009.

* cited by examiner

*Primary Examiner* — Arleen M Vazquez
*Assistant Examiner* — Son Le
(74) *Attorney, Agent, or Firm* — Michelle S. Gallardo

(57) ABSTRACT

By constructing a universal test circuit on a tester chip, and stacking the tester chip in an IC package together with operational circuit chips to be tested, the problems inherent with external IC testing are reduced. The tester chip can be standardized across a number of different chip combinations and, if desired, pre-programmed during manufacturing for a particular package. The tester chip interfaces to other chips in the stack advantageously are standardized.

6 Claims, 3 Drawing Sheets

INTEGRATED TESTER CHIP USING DIE PACKAGING TECHNOLOGIES

CROSS REFERENCE TO RELATED APPLICATION

This application is a continuation-in-part of prior U.S. patent application Ser. No. 12/147,918 to KASKOUN et al. entitled "INTEGRATED TESTER CHIP USING DIE PACKAGING TECHNOLOGIES" filed on Jun. 27, 2008.

TECHNICAL FIELD

This disclosure relates generally to integrated circuit (IC) testing and more particularly to systems and methods for testing multi-tiered IC devices.

BACKGROUND

Typically, during the manufacturing process of an IC, testing (probing) is performed on the IC prior to the time the IC is mounted into a package. In some instances the probing is performed after the IC is mounted. However, in situations where multiple ICs are stacked into tiers, it is difficult to probe the ICs due to inaccessibility of test terminals on the outside of the stacked device.

The problem is compounded when a tier does not include a complete circuit. Thus, in situations where portions of a testable circuit are constructed on different tiers, it is not feasible to test the complete circuit until the dies are stacked into the final multi-tiered IC device (also referred to as a stacked IC device). Moreover, once stacked accessibility for test purposes may be limited.

One solution to this problem is to bring test leads to accessible locations on the periphery of the stacked device. This, however, in many situations is either not possible due to space constraints, signal propagation times, or simply because it is too expensive. Another problem is that the small size of stacked devices may require small electrical pads and through silicon vias (TSV), which may range in size to less than 10 microns, which in turn do not easily lend to testing with conventional probe tips (typically 25-50 microns). For testing, multiple probe tips usually must make contact at the same time, so even when each individual probe tip is small enough, a large number of probe tips becomes difficult to manage.

BRIEF SUMMARY

By constructing a universal test circuit on a die (or chip), and stacking the test die in the IC package together with other dies to be tested, the problems inherent with external IC testing are reduced. The tester chip would be standardized across a number of different chip combinations, and if desired, pre-programmed during manufacturing for a particular package. Standardization includes a standard input/output (I/O) configuration, as well as industry standard tester software programs. The standardization allows tester chips to test a wide variety of different products (chip combinations).

One advantage of such an arrangement is that it decouples tester chip development from the design or fabrication of the operational chip itself. Thus, a company could dedicate resources to working on the tester chip in a continuous mode, independent from a particular product. Consequently, the design of a tester chip would not necessarily need to keep pace with the design schedules for any particular product.

The foregoing has outlined, rather broadly, the features and technical advantages of the present invention in order that the detailed description that follows may be better understood. Additional features and advantages of the invention will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the teachings of the invention as set forth in the appended claims. The novel features, which are believed to be characteristic of the invention, both as to its organization and method of operation, together with further objects and advantages, will be better understood from the following description when considered in connection with the accompanying figures. It is to be expressly understood, however, that each of the figures is provided for the purpose of illustration and description only, and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
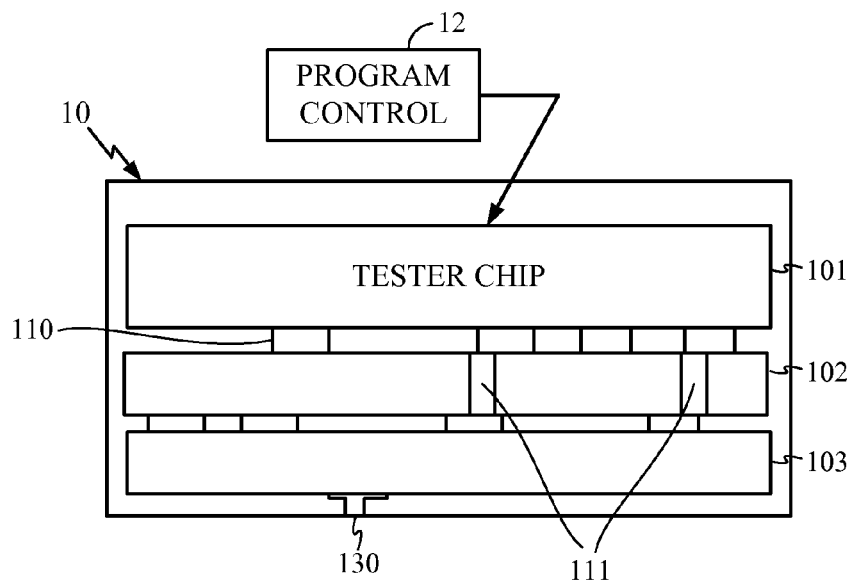
FIG. 1 shows one configuration of an embodiment in which a tester chip is contained within an IC package.

FIG. 1 shows one configuration of an embodiment in which a tester chip is contained within IC package 10. In the embodiment shown, IC tiers 101, 102, 103 are stacked to create a stacked IC device. This is only one example of how the tiers 101, 102, 103 can be assembled. Note that while three tiers are shown, the concepts discussed herein can be used with any number of tiers, including a single tier.

IC package 10 contains a tester chip in tier 101 electrically connected to one or more chips in tier 102 by contacts 110. The tester chip is the only occupant of the tier (i.e., 101) in the embodiment of FIG. 1. Vias 111 are shown constructed in chips in tier 102 to facilitate heat transfer and/or electrical connections among the tiers 101, 102, 103. Not shown in tiers 101, 102, 103, are active circuits and other elements formed in chips in the different tiers using standard IC processes all now well-known to those skilled in the art. Contact 130 can be used, for example, to make electrical contact with components outside IC package 10. As will be discussed, a program control 12 optionally can be used to input testing programming control data to IC package 10 to control tester chip 101 to test one or more circuits on chips in tier 102 and/or tier 103.

The tester chip in tier 101 may be a universal tester chip, meaning that it can be used to test various different circuits and/or circuit combinations. The 'universal' feature is enabled through a standard I/O configuration. In one embodiment, the I/O configuration includes only a few pins, such as a ground pin, a positive supply voltage pin, an input pin and an output pin. In another embodiment, the I/O configuration includes a ground pin, a positive supply voltage pin, and individual pins for each circuit block being tested (e.g., memory I/O tester pin, logic tester pin, RF tester pin, and analog tester pin, etc.). Each circuit block could have its own separate tester read out pin. In another embodiment, a single tester read out pin indicates results of the testing. In one embodiment, the results are simply whether a good or bad test result occurred. In alternate embodiments, detailed information about the test results is provided via the read out pin(s).

If desired, programming for testing a specific circuit can be built into the tester chip in tier 101 during manufacture, or the tester chip in tier 101 can be built with an ability to receive instructions (programming) at a later time. These instructions can be added to the tester chip in tier 101 before the tester chip is added to an IC package 10 in tier 101 or after. The instructions can be made permanent or temporary, and can be contained in a memory which is also placed into the IC package 10. The memory containing the instructions could be part of the tester chip in tier 101 or added to the tester chip in tier 101 just prior to introducing the tester chip into tier 101 of a specific IC package 10.

Operation of IC package 10 is such that at some point in time, as will be discussed hereinafter, the tester chip in tier 101 is activated, either from an external stimulus, for example via contact 130 or program control 12, to perform testing on some or all of the circuitry contained within IC package 10. One or many test routines may be performed on all or some of the circuitry contained within IC package 10. These test routines can be pre-programmed into the tester chip in tier 101 or may, as discussed, be contained in a separate memory. The instructions can be permanent or can last only for a period of time.

As discussed above, in some cases the operational circuitry that is being tested may be circuitry that partially resides on one tier and partially resides on one or more other tiers, all interconnected by contacts 110 and/or vias 111.

Figure 2:
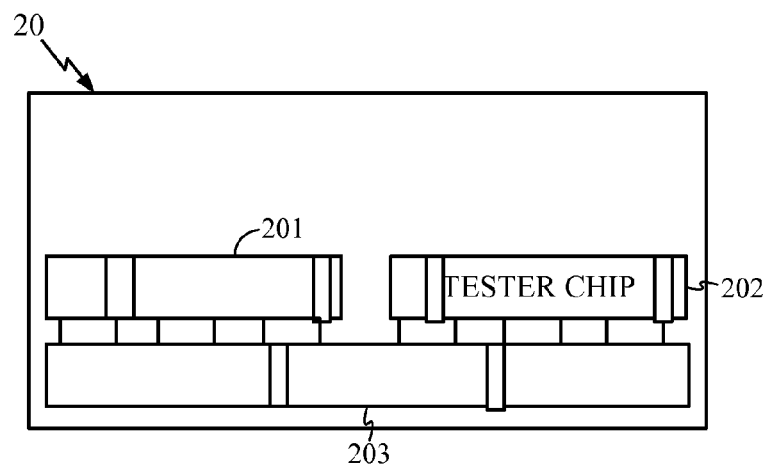
FIGS. 2 and 3 show other configurations of different embodiments in which a tester chip is contained within an IC package.

FIG. 2 shows another configuration of an embodiment in which a tester chip 202 is contained within an IC package 20. In this embodiment, tester chip 202 shares the same tier with chip 201 containing one or more operational circuits (not shown). A second tier contains operational chip 203.

Figure 3:
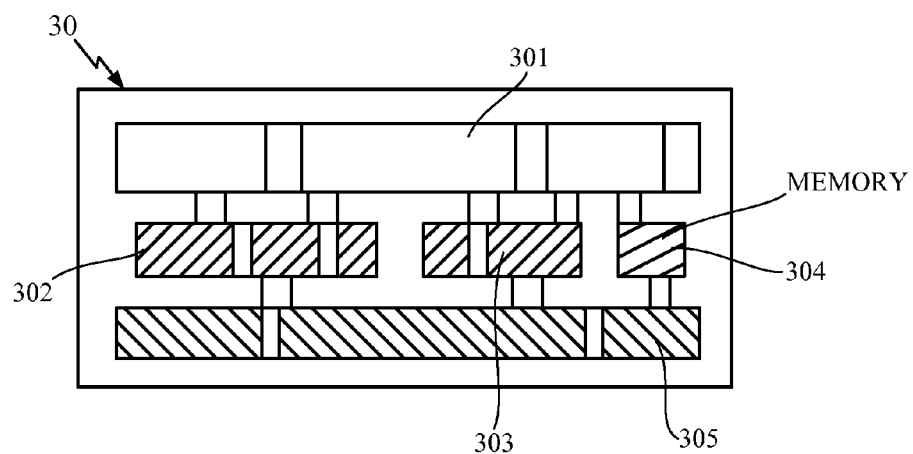

FIG. 3 shows another configuration of an embodiment in which tester chip 302 is contained within an IC package 30. Operational chips, such as memory chip 304 along with another operational chip 303 (e.g., a processor, RF chip, etc.), share a tier with the tester chip 302. Programming instructions could be contained within memory 304. These instructions could be programmed into the memory either before the memory is positioned within the IC package 30 or thereafter. If the programming of the memory 304 occurs after the tester chip 302 is sealed within the IC package 30 then the test data can be supplied via contacts on the IC package 30 or via a wireless connection. This wireless connection can be, for example, RF, infrared, or any wireless protocol. The receiver for such wireless transmission can be built into one or more of the chips contained within the IC package 30. Also contained in IC package 30 are operational chips 301 and 305.

Figures 4, 5:
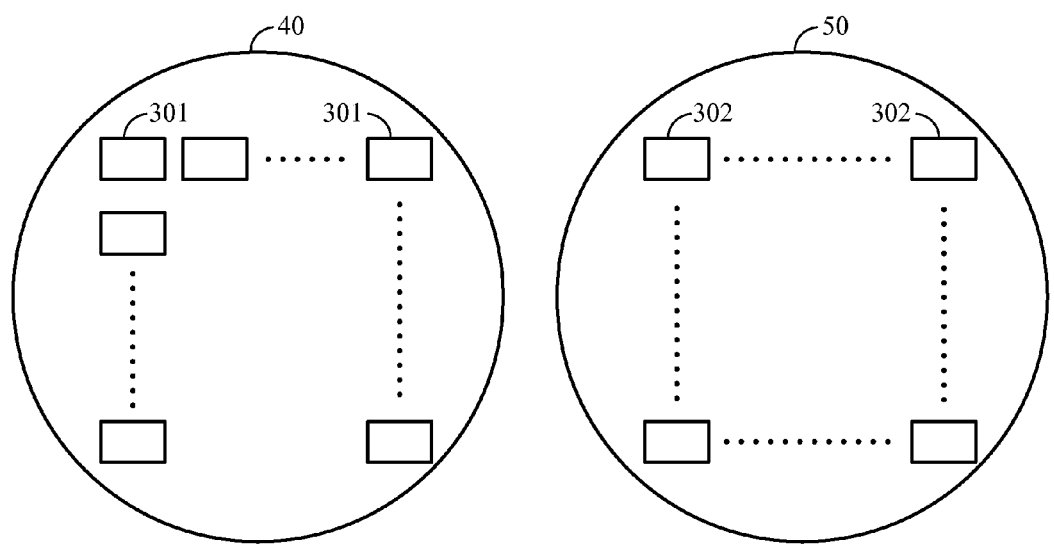
FIGS. 4 and 5 show examples of chips manufactured as part of wafers according to embodiments of the invention.

FIG. 4 shows an example of chips, such as operational chips 301 being manufactured as part of a wafer, such as wafer 40. In some cases, a portion of each chip 301 can be tested while still part of the wafer. In other situations, such testing may not be feasible.

FIG. 5 shows wafer 50 on which are constructed dies of tester chip 302 which may be universal tester chips as discussed above. Each of these tester chips 302 is constructed the same regardless of which IC package the chip will actually become a part of. In one embodiment, each tester chip 302 can be identified as "belonging" to a particular IC package. In such a situation, if desired, the tester chip 302 can have loaded therein a test program unique to the identified IC package. In other situations, the tester chip 302 will be separated from the wafer 50 prior to any specific programming. In such a situation, as will be discussed, any desired unique programming will be added to the tester chip 302 at a later time.

It should be noted that while the tester chip 302 is shown as being constructed in conjunction with a wafer 50 of similar chips, the tester chip (or chips) 302 can be constructed on the same wafer 50 as the operational circuit chips 301.

Figure 6:
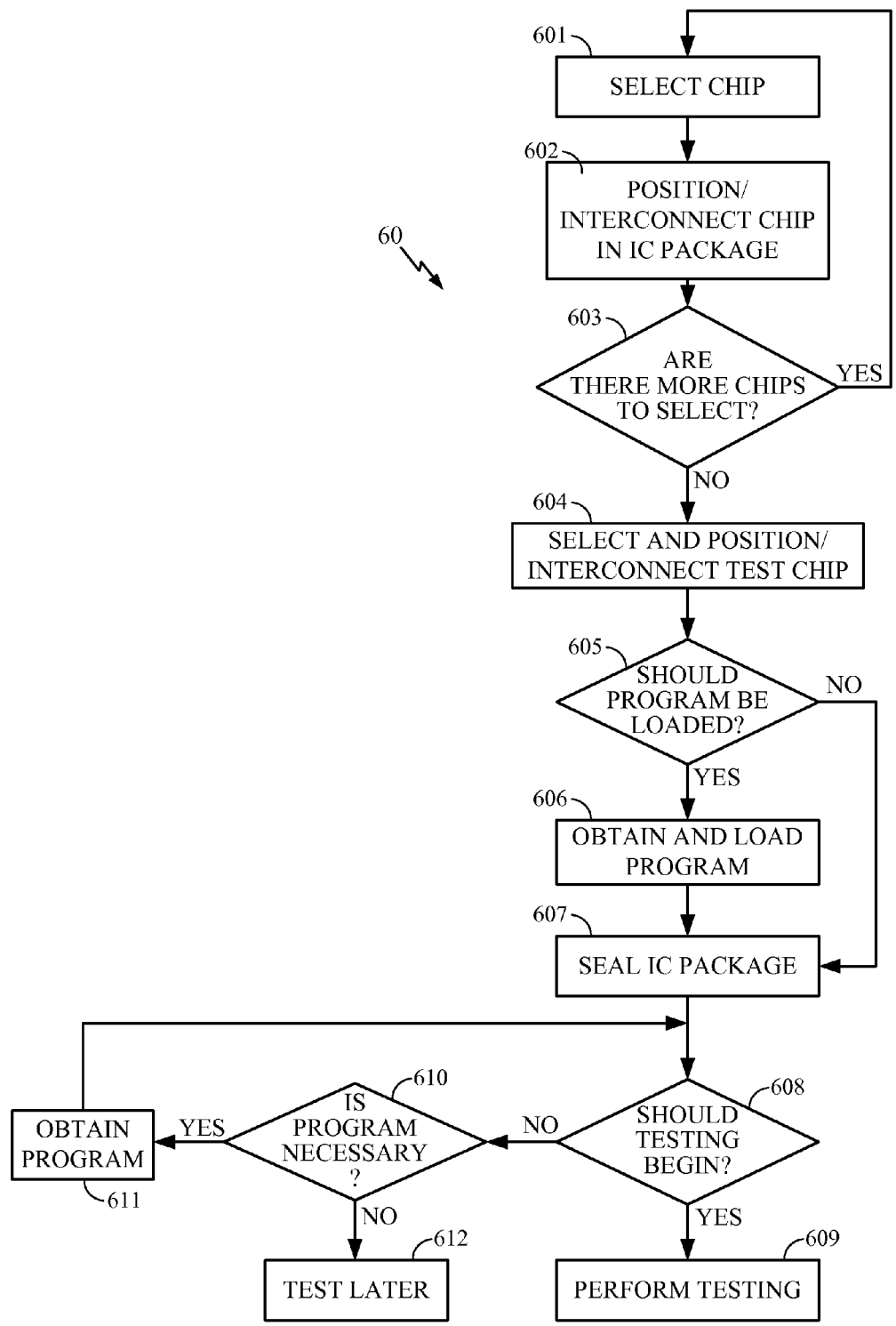
FIG. 6 shows one embodiment of a method of constructing an IC package.

FIG. 6 shows one embodiment of a method 60 of constructing an IC package. Block 601 controls the selection of a die (or chip) that is to be incorporated into an IC package. The selected die can be pre-tested to the extent possible, but in many situations such pre-testing may not completely test the die for a variety of reasons. One of these reasons may be, as discussed, the fact that a complete operational circuit does not exist until two or more dies are stacked together in a stacked IC device and cooperatively interconnected, for example, in a timing path where a launching latch is on a different tier from a capturing latch in a pipeline stage.

Block 602 positions and interconnects the selected die into the IC package. Block 603 then determines if there are other dies to be added to the package. If so, the other dies are selected and positioned. When all the dies have been properly positioned, interconnected and/or stacked into the package, block 604 selects, positions, and interconnects a universal tester chip. Typically, the stacked IC device would be stacked tier by tier with operational and/or tester chips positioned on a tier and then another tier added. Thus, process 60, or a portion thereof, can be repeated on a tier by tier basis if desired.

Block 605 determines if a test routine program should be loaded into the selected tester chip or into another memory that has been selected to be in the IC package. Such programming would convert the universal tester chip into a more specific tester chip arranged specifically to test the operational circuit chips in the IC package into which the tester chip is to be inserted. If so, then block 606 obtains and loads the proper test program.

Block 607 seals the stacked IC device within a self-contained package. Note that the tester chip, in one embodiment, may be sealed within the package and will remain within the package through the life of the package. In other embodiments, the tester chip is positioned in such a manner that it, or part of it, may be removed after testing. For example, if the tester chip were to be positioned on a top or bottom tier, then after testing the tier containing the tester chip could be removed if the test chip is the only chip on the tier, or only the test chip could be removed, if other chips exist on the tier. Removal is possible when the tester chip(s) were mounted at one end of the IC package. In one embodiment, the test chip is removable as a result of bonding with a temporary bond. In one example, a temporary bond is created by soldering the tester chip in place and then removing the tester chip by heating (de-soldering). Another example for a temporary bond uses Antistrophic conductive pastes with metal fillers. Yet another example includes a socketed connection. In a further example, the tester chip is aligned and held under pressure and heat during the testing operation and then removed after the testing operation.

Blocks 608 and 609 control the timing of the testing of the circuits under control of the associated tester chip in conjunction with any added programming. In some situations, external stimuli can be provided, as discussed above, to initiate and/or control the testing of the stacked IC device.

If testing is not to begin, as determined by blocks 608, then block 610 determines if a test program or other stimulus is required. If not, testing is performed at a later time as controlled by block 612. If block 610 determines that additional programs or stimuli are required then block 611 obtains the necessary programs and/or stimuli. Block 608 then again determines if it is time for testing to begin.

Note that process 60 shows that the tester chip is selected after the other chips are selected and positioned. This is but one embodiment and the tester chip can be selected at any time and positioned at any time in any desired tier of the IC device.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit (IC) package comprising:
 a plurality of tiers including one or more circuit chips, in which each circuit chip performs a different function;
 a plurality of circuits under test included in the one or more circuit chips, at least one of the plurality of circuits under test having logical components on different tiers;
 a tester chip on a different tier from the one or more circuit chips, the tester chip consisting of a test circuit operable to test each of the different functions of the one or more circuit chips within the IC package, the tester chip including an external pin for each of the plurality of circuits, through which each circuit of the IC package is tested, the tester chip operable to communicate with the plurality of circuits through vias, the tester chip including a standardized interface to the one or more circuit chips to test the different functions of the one or more circuit chips; and
 a memory separate from the tester chip and mounted on one of the plurality of tiers within the IC package, the memory configured to store a program designed to control the test circuit on the tester chip, the test circuit to perform validation testing on the plurality of circuits, the program downloaded to the memory after the memory is positioned in the IC package.

2. A method for testing a stacked integrated circuit (IC) device within an IC package, said method comprising:
 positioning a plurality of chips and a tester chip, consisting of a test circuit, on a plurality of tiers of the IC package, each chip operable to perform a different function, the tester chip including an external pin for each of the plurality of chips, through which each circuit of each chip of the stacked IC device is tested, the tester chip positioned on a different tier from the plurality of chips, said positioning comprising electrically coupling said plurality of chips with through vias;
 interfacing with the plurality of chips through a standardized interface to test the different functions of the plurality of chips;
 providing test instructions to at least one of the plurality of chips and the tester chip, wherein said test instructions are provided to at least one of said plurality of chips and the tester chip prior to said positioning; and
 testing with the tester chip, a function of said plurality of chips under control of at least one of said coupled chips by communication through at least some of the through vias.

3. An integrated circuit (IC) package comprising:
 at least one circuit constructed on both a first chip in a first tier including a launching latch in a pipeline stage, and a second chip in a second tier including a capturing latch in the pipeline stage, the first chip and the second chip operable to perform different functions associated with the at least one circuit;
 a third chip consisting of a test circuit, the third chip including an external pin for each of the first and second chips, through which each circuit of the first chip and the second chip of the IC package is tested, the third chip on a different tier from the first and second chips, the third chip operable to communicate with the first chip and the second chip with a plurality of through vias, said test circuit capable of testing a function of said at least one circuit, as well as a plurality of circuits contained in the IC package, the third chip including a standardized interface to the first chip and the second chip to test different functions of the first chip and the second chip; and
 means for wirelessly receiving operational instructions unique to the at least one circuit, the operational instructions used to configure the test circuit, wherein the operational instructions are contained in a memory resident within the IC package.

4. A method for constructing a stacked integrated circuit (IC) device, said method comprising:
 selecting a plurality of chips, in which each of the plurality of chips performs a different function, a plurality of circuits under test included in the plurality of chips;
 selecting at least one tester chip consisting of a test circuit capable of testing a plurality of coupled combinations of the plurality of circuits of the plurality of chips on tiers different from a tier of the at least one tester chip, the tester chip including a tester pin for each of the plurality of circuits, through which each circuit of the stacked IC device is tested, the tester chip including a standardized interface to each of the plurality of chips to test the plurality of coupled combinations of the plurality of circuits;
 stacking said plurality of chips, and said tester chip, such that portions of said plurality of chips become electrically coupled with vias, and so that circuits of the plurality of chips split across tiers become testable, wherein said stacked chips are in the stacked IC device, in which the stacked chips communicate with through vias; and
 programming the at least one tester chip to perform testing on the stacked chips, wherein the programming is performed from time to time or prior to said stacking, and wherein the time to time programming is wirelessly communicated to the stacked IC device.

5. An integrated circuit (IC) package comprising:
 a plurality of tiers including one or more circuit chips, in which each circuit chip performs a different function;
 a plurality of circuits under test included in the one or more circuit chips, at least one of the plurality of circuits under test having logical components on different tiers;

a tester chip consisting of means for testing each of the different functions of the one or more circuit chips within the IC package, the tester chip including an external pin for each of the plurality of circuits, through which each circuit of the IC package is tested, the tester chip disposed on a different tier from the plurality of circuits, the tester chip operable to communicate with the plurality of circuits through vias, the tester chip including a standardized interface to the one or more circuit chips to test the different functions of the one or more circuit chips; and a memory separate from the tester chip and mounted on one of the plurality of tiers within the IC package, the memory configured to store a program designed to control the testing means on the tester chip, the testing means to perform validation testing on the plurality of circuits, the program downloaded to the memory after the memory is positioned in the IC package.

6. An integrated circuit (IC) package comprising:

at least one circuit constructed on both a first chip in a first tier including a launching latch in a pipeline stage, and a second chip in a second tier including a capturing latch in the pipeline stage, the first chip and the second chip operable to perform different functions associated with the at least one circuit;

a third chip consisting of a means for testing a function of the at least one circuit, the third chip including a tester pin for each of the first and second chips, through which each circuit of the first chip and the second chip of the IC package is tested, the third chip on a different tier from the first and second chips, the third chip operable to communicate with the first chip and the second chip with a plurality of through vias, as well as a plurality of circuits contained in the IC package, the third chip including a standardized interface to the first chip and the second chip to test different functions of the first chip and the second chip; and means for wirelessly receiving operational instructions unique to the at least one circuit, the operational instructions used to configure the testing means, wherein the operational instructions are contained in a memory resident within the IC package.

* * * * *